(12) United States Patent
Huang

(10) Patent No.: US 12,092,672 B2
(45) Date of Patent: Sep. 17, 2024

(54) CAPACITANCE MEASUREMENT CIRCUIT

(71) Applicant: Elite Semiconductor Microelectronics Technology Inc., Hsinchu (TW)

(72) Inventor: Yi-Chou Huang, Hsinchu (TW)

(73) Assignee: Elite Semiconductor Microelectronics Technology Inc., Hsinchu (TW)

( * ) Notice: Subject to any disclaimer, the term of this patent is extended or adjusted under 35 U.S.C. 154(b) by 176 days.

(21) Appl. No.: 17/964,847

(22) Filed: Oct. 12, 2022

(65) Prior Publication Data

US 2024/0133934 A1 Apr. 25, 2024

(51) Int. Cl.
*G01R 27/26* (2006.01)
*H03F 3/45* (2006.01)
*H03M 3/00* (2006.01)

(52) U.S. Cl.
CPC ..... *G01R 27/2605* (2013.01); *H03F 3/45475* (2013.01); *H03M 3/30* (2013.01); *H03F 2200/213* (2013.01); *H03F 2200/271* (2013.01); *H03F 2203/45156* (2013.01)

(58) Field of Classification Search
CPC . G01R 27/2605; G01R 27/26; H03F 3/45475; H03F 2200/213; H03F 2200/271; H03F 2203/45156; H03M 3/30
See application file for complete search history.

(56) References Cited

U.S. PATENT DOCUMENTS

| | | | | |
|---|---|---|---|---|
| 7,288,946 | B2* | 10/2007 | Hargreaves | G01R 27/2605 324/678 |
| 8,390,361 | B2* | 3/2013 | Ningrat | G06F 3/04182 345/174 |
| 10,817,114 | B2* | 10/2020 | Sasai | G01R 27/26 |
| 2018/0011125 | A1* | 1/2018 | Oshima | G01P 15/125 |

* cited by examiner

*Primary Examiner* — Reena Aurora
(74) *Attorney, Agent, or Firm* — Winston Hsu

(57) ABSTRACT

A capacitance measure circuit includes a charge to voltage converter (CVC), and the CVC includes an excitation signal generation circuit that is arranged to generate and connect an excitation signal to a first terminal of a capacitance sensor, a differential amplifier, a first switch circuit, and at least one first variable capacitor. The inverting input terminal of the differential amplifier is arranged to receive a sensing capacitance value from a second terminal of the capacitance sensor. The first switch circuit is coupled between the inverting input terminal and the non-inverting output terminal of the differential amplifier, and is connected in parallel with the at least one first variable capacitor at the inverting input terminal and the non-inverting output terminal of the differential amplifier.

16 Claims, 5 Drawing Sheets

CAPACITANCE MEASUREMENT CIRCUIT

BACKGROUND OF THE INVENTION

1. Field of the Invention

The present invention is related to capacitance measurement, and more particularly, to a capacitance to digital converter (CDC) and a charge to voltage converter (CVC) therein.

2. Description of the Prior Art

For a conventional CVC within a CDC, an amplifier within the CVC may have an input offset voltage problem. Under a condition that a capacitance value sensed by a capacitance sensor includes a parasitic capacitance value, the CVC that receives the sensed capacitance value may not be able to eliminate the problem of the parasitic capacitor. In addition, the CVC may be a single-terminal input and single-terminal output configuration, which may limit design flexibility, and a capacitance-to-voltage result generated by the CVC may vary with the supply voltage provided to the CVC, which may cause some problems with a digital pulse stream eventually generated by the CDC.

SUMMARY OF THE INVENTION

It is one of the objectives of the present invention to provide a capacitance measurement circuit, to solve the above-mentioned problems.

According to an embodiment of the present invention, a capacitance measurement circuit is provided. The capacitance measurement circuit may include a CVC. The CVC may include an excitation signal generation circuit, a differential amplifier, a first switch circuit, and at least one first variable capacitor. The excitation signal generation circuit may be arranged to generate and connect an excitation signal to a first terminal of a capacitance sensor. The differential amplifier has an inverting input terminal, a non-inverting input terminal, an inverting output terminal, and a non-inverting output terminal, wherein the inverting input terminal may be arranged to receive a sensing capacitance value from a second terminal of the capacitance sensor. The first switch circuit may be coupled between the inverting input terminal and the non-inverting output terminal of the differential amplifier, and the first switch circuit and the at least one variable capacitor may be connected in parallel at the inverting input terminal and the non-inverting output terminal of the differential amplifier.

In addition, the CVC may be arranged to generate an output voltage according to the sensing capacitance value. The capacitance measurement circuit may be a CDC, and further include an analog to digital converter (ADC), wherein the ADC may be arranged to convert the output voltage into a digital pulse stream.

One of the benefits of the present invention is that, in the CVC of the present invention, the differential amplifier within the CVC will not have the input offset voltage problem by the configuration between the differential amplifier, the switch circuit and the at least one first variable capacitor. Under a condition that the sensing capacitance value sensed by the capacitance sensor includes a parasitic capacitance value, parasitic capacitance value can be eliminated by the parasitic capacitance cancellation circuit. In addition, the CVC is a single-terminal input and double-terminal output configuration through the differential architecture, which can increase the design flexibility, and the output voltage generated by the CVC will not vary with the supply voltage by the slew rate limiter.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
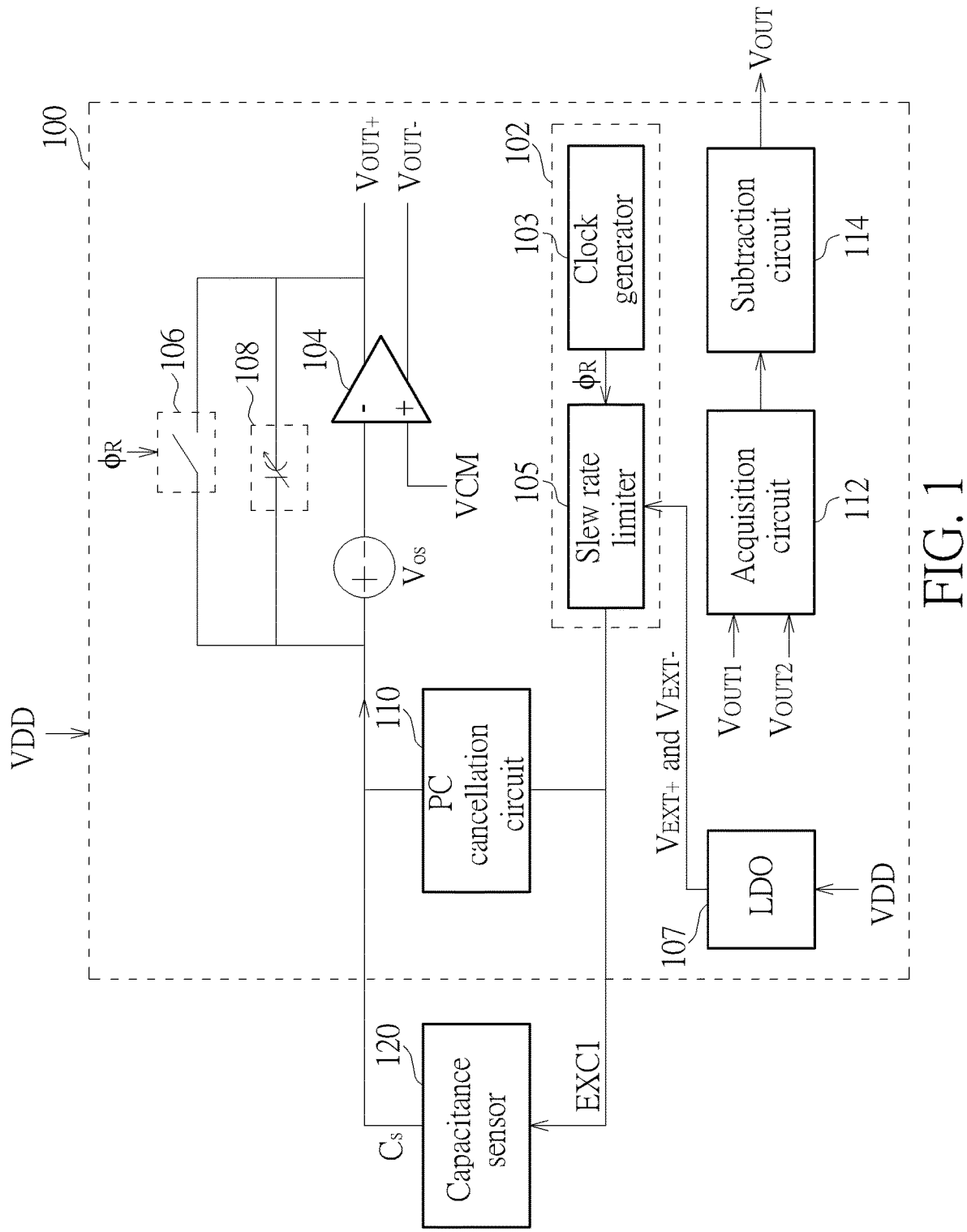
FIG. 1 is a diagram illustrating a charge to voltage converter according to a first embodiment of the present invention.

FIG. 1 is a diagram illustrating a charge to voltage converter (CVC) 100 according to a first embodiment of the present invention. As shown in FIG. 1, the CVC 100 may include an excitation signal generation circuit 102, a differential amplifier 104, a switch circuit 106, at least one variable capacitor 108, a parasitic capacitance cancellation circuit (for brevity, labeled as "PC cancellation circuit" in FIG. 1) 110, an acquisition circuit 112, and a subtraction circuit 114, and a supply voltage VDD may be supplied to the CVC 100. In addition, there is a capacitance sensor 120 external to the CVC 100, wherein the capacitance sensor 120 has a two-terminal connection architecture. The capacitance sensor 120 may act as a variable component where the dynamic range of the sensing capacitance value Cs will be changed according to the external environment. The CVC 100 may be arranged to generate an output voltage $V_{OUT}$ according to the sensing capacitance value $C_s$.

The excitation signal generation circuit 102 may include a clock generator 103 and a slew rate limiter 105. The clock generator 103 may be arranged to generate a clock signal $\Phi_R$. In this embodiment, the clock signal $\Phi_R$ may be a square wave with 32 kHz, wherein a high voltage level of the clock signal $\Phi_R$ may be the supply voltage VDD, and a low voltage level of the clock signal $\Phi_R$ may be a reference voltage (e.g. a ground voltage GND). Under a condition that the clock signal $\Phi_R$ is directly connected to the capacitance sensor 120 for capacitance sensing, the square wave rises and falls sharply between the high voltage level and the low voltage level, which may cause the electromagnetic interference (EMI) and interfere the electronic components nearby. In addition, if the supply voltage VDD is supplied by a battery, the supply voltage VDD may drop during the long term operation of the CVC 100, and a voltage signal that is arranged to charge and discharge the sensing capacitance 120 through the clock signal $\Phi_R$ (e.g. the high voltage level of the clock signal $\Phi_R$) may not be a fixed value, which may cause the output voltage $V_{OUT}$ generated by the CVC 100 to change with the supply voltage VDD. To solve this issue, the slew rate limiter 105 may be arranged to perform a slew rate limitation operation upon the clock signal $\Phi_R$, to generate an excitation signal EXC1 to a first terminal of the capacitance sensor 120.

In this embodiment, the CVC 100 may further include a low dropout (LDO) regulator 107. The LDO regulator 107 may be arranged to regulate the supply voltage VDD, and generate an excitation voltage $V_{EXT+}$ that is different from the supply voltage VDD and another excitation voltage $V_{EXT-}$ that is different from the ground voltage GND and lower than the excitation voltage $V_{EXT+}$, wherein the excitation voltages $V_{EXT+}$ and $V_{EXT-}$ may be transmitted to the slew limiter 105, and the slew limiter 105 may be arranged to perform a slew rate limitation operation upon the clock signal $\Phi_R$ (e.g. limit the high voltage level of the clock signal $\Phi_R$ as the excitation voltage $V_{EXT+}$, and limit the low voltage level of the clock signal $\Phi_R$ as the excitation voltage $V_{EXT-}$), to generate the excitation signal EXC1. In this way, the output voltage $V_{OUT}$ of the CVC 100 is insensitive to the supply voltage VDD.

The differential amplifier 104 has an inverting input terminal (labeled as "−" in FIG. 1), a non-inverting input terminal (labeled as "+" in FIG. 1), a non-inverting output terminal (i.e. a terminal from which a first differential output voltage $V_{OUT+}$ is output), and an inverting output terminal (i.e. a terminal from which a second differential output voltage $V_{OUT-}$ is output), wherein the inverting input terminal may be arranged to receive the sensing capacitance value $C_s$ from a second terminal of the capacitance sensor 120, the non-inverting input terminal may be coupled to a common-mode voltage (labeled as "VCM" in FIG. 1), and the output voltage $V_{OUT}$ is a voltage difference between the inverting output terminal and the non-inverting output terminal of the differential amplifier 104 (i.e. $V_{OUT}=V_{OUT+}-V_{OUT-}$). The switch circuit 106 may be coupled between the inverting input terminal and the non-inverting output terminal of the differential amplifier 104, wherein the switch circuit 106 is controlled by a control signal that is in-phase with the excitation signal EXC1. For example, the control signal may be the clock signal $\Phi_R$. It is assumed that in response to the clock signal $\Phi_R$ being at the high voltage level (i.e. the supply voltage VDD), the switch circuit 106 is closed. In response to the clock signal $\Phi_R$ being at the low voltage level (i.e. the ground voltage GND), the switch circuit 106 is open. In addition, the switch circuit 106 and the at least one variable capacitor 108 may be connected in parallel at the inverting input terminal and the non-inverting output terminal of the differential amplifier 104.

The configuration between the switch circuit 106, the at least one variable capacitor 108, and the differential amplifier 104 may be arranged to reduce/cancel an input offset voltage $V_{os}$ at the inverting input terminal of the differential amplifier 104, but the present invention is not limited thereto. In some embodiments, the input offset voltage $V_{os}$ is at the non-inverting terminal of the differential amplifier 104. In detail, under a condition that the switch circuit 106 is closed, a first voltage difference $V_{OUT1}$ between the inverting output terminal and the non-inverting output terminal of the differential amplifier 104 (i.e. $V_{OUT1}=V_{OUT+}-V_{OUT-}$) may be obtained by an equation expressed as follows:

$$\left(\frac{V_{OUT1}}{-A}\right) + V_{OS} = V_{OUT1}$$

wherein A is a gain of the differential amplifier 104, and $V_{os}$ is the input offset voltage $V_{os}$. The above equation may be simplified as follows:

$$V_{OUT1} = \left[\frac{A}{(1+A)}\right]V_{OS} \sim V_{OS}$$

wherein the first voltage difference $V_{OUT1}$ is approximately equal to the input offset voltage $V_{os}$.

Under a condition that the switch circuit 106 is open, a second voltage difference $V_{OUT2}$ between the inverting output terminal and the non-inverting output terminal of the differential amplifier 104 (i.e. $V_{OUT2}=V_{OUT+}-V_{OUT-}$) may be obtained by an equation expressed as follows:

$$C_s*(V_{OS}-V_{EXT+})=C_i*(V_{OS}-V_{OUT2})+C_s*(V_{OS}-V_{EXT-})$$

wherein Cs is the sensing capacitance value $C_s$, $V_{os}$ is the input offset voltage Vos, $V_{EXT+}$ is the high voltage level of the excitation signal EXC1, $C_i$ is a capacitance value of the at least one variable capacitor 108, and $V_{EXT-}$ is the low voltage level of the excitation signal EXC1. The above equation may be simplified as follows:

$$V_{OUT2} = (V_{EXT+} - V_{EXT-}) * \frac{C_S}{C_i} + V_{OS}$$

In response to the switch circuit 106 being closed, the acquisition circuit 112 may be arranged to acquire the first voltage difference $V_{OUT1}$. In response to the switch circuit 106 being open, the acquisition circuit 112 may be arranged to acquire the second voltage difference $V_{OUT2}$. The subtraction circuit 114 may be coupled to the acquisition circuit 112, and may be arranged to subtract the first voltage difference $V_{OUT1}$ from the second voltage difference $V_{OUT2}$, to reduce/cancel the input offset voltage $V_{os}$ and generate the output voltage $V_{OUT}$ of the CVC 100 (i.e. $V_{OUT}=V_{OUT2}-V_{OUT1}$). The output voltage $V_{OUT}$ may be expressed by the following equation:

$$V_{OUT} = (V_{EXT+} - V_{EXT-}) * \frac{C_S}{C_i}$$

wherein the output voltage $V_{OUT}$ is proportional to the sensing capacitance value $C_s$, and the output voltage $V_{OUT}$ is insensitive to the supply voltage VDD.

It should be noted that, the differential amplifier 104 may be a chopper amplifier, that is, the differential amplifier 104 may be equipped with function of several pairs of switches. In addition, the maximum value of the sensing capacitance value $C_s$ obtained by the capacitance sensor 120 may vary according to the operation environment. Under a condition that a capacitance value $C_i$ of the at least one variable capacitor 108 is a fixed value, a full-load output voltage $V_{OUT\_FULL}$ of the CVC 100 may change with the maximum value of the sensing capacitance value $C_s$. To solve this issue, the at least one variable capacitor 108 may have multiple capacitance values to be selected. For example, a register (not shown) may be arranged to set up the at least one variable capacitor 108 to select one of the multiple capacitance values as the capacitance value $C_i$ of the at least one variable capacitor 108, to make a ratio of the sensing capacitance value $C_s$ to said one of multiple capacitance values be a fixed value. In this way, by adjusting the capacitance value $C_i$ of the at least one variable capacitor 108, a dynamic range of the external capacitor can be adjusted.

TABLE 1

| $C_s$ | $C_i$ | $V_{OUT\_FULL}$ |
|---|---|---|
| 4 pF | 13.728 pF | ΔV * 0.2914 |
| 2 pF | 6.864 pF | ΔV * 0.2914 |
| 1 pF | 3.432 pF | ΔV * 0.2914 |
| 0.5 pF | 1.716 pF | ΔV * 0.2914 |

Table 1 illustrates an example of selection of the multiple capacitance values by the at least one variable capacitor 108 according to the sensing capacitance value $C_s$. It is assumed that the maximum value of the sensing capacitance value $C_s$ may be 4 pF, 2 pF, 1 pF, or 0.5 pF, and the multiple capacitance values that may be selected as the capacitance value $C_i$ of the at least one variable capacitor 108 may be 13.728 pF, 6.864 pF, 3.432 pF, and 1.716 pF. Under a condition that the maximum value of the sensing capacitance value $C_s$ is 4 pF, 13.728 pF may be selected as the capacitance value $C_i$ of the at least one variable capacitor 108, to make the ratio of the sensing capacitance value $C_s$ to the capacitance value $C_i$ be 0.2914 (i.e.

$$\frac{C_S}{C_i} = 0.2914),$$

and the full-load output voltage $V_{OUT\_FULL}$ may be ΔV*0.2914, wherein ΔV is a voltage difference between the high voltage level of the excitation signal EXC1 and the low voltage level of the excitation signal EXC1 (i.e. $\Delta V = V_{EXT+} - V_{EXT-}$). Under a condition that the maximum value of the sensing capacitance value $C_s$ is 2 pF, 6.864 pF may be selected as the capacitance value $C_i$ of the at least one variable capacitor 108, to make the ratio of the sensing capacitance value $C_s$ to the capacitance value $C_i$ be 0.2914 (i.e.

$$\frac{C_S}{C_i} = 0.2914),$$

and the full-load output voltage $V_{OUT\_FULL}$ may be ΔV*0.2914. Under a condition that the maximum value of the sensing capacitance value $C_s$ is 1 pF, 3.432 pF may be selected as the capacitance value $C_i$ of the at least one variable capacitor 108, to make the ratio of the sensing capacitance value $C_s$ to the capacitance value $C_i$ be 0.2914 (i.e.

$$\frac{C_S}{C_i} = 0.2914),$$

and the full-load output voltage $V_{OUT\_FULL}$ may be ΔV*0.2914. Under a condition that the maximum value of the sensing capacitance value $C_s$ is 0.5 pF, 1.716 pF may be selected as the capacitance value $C_i$ of the at least one variable capacitor 108, to make the ratio of the sensing capacitance value $C_s$ to the capacitance value $C_i$ be 0.2914 (i.e.

$$\frac{C_S}{C_i} = 0.2914),$$

and the full-load output voltage $V_{OUT\_FULL}$ may be ΔV*0.2914.

The parasitic capacitance cancellation circuit 110 may be arranged to reduce/cancel a parasitic capacitance value $C_P$ from the sensing capacitance value $C_s$. In this embodiment, the parasitic capacitance cancellation circuit 110 may be coupled between the slew rate limiter 105 and the inverting input terminal of the differential amplifier 104. In some embodiment, the parasitic capacitance cancellation circuit 110 may be coupled between the slew rate limiter 105 and the non-inverting input terminal of the differential amplifier 104 (i.e. the non-inverting input terminal of the differential amplifier 104 may be modified to be coupled to the parasitic capacitance cancellation circuit 110). In some embodiment, the parasitic capacitance cancellation circuit 110 may only be coupled to the inverting input terminal of the differential amplifier 104.

Figure 2:
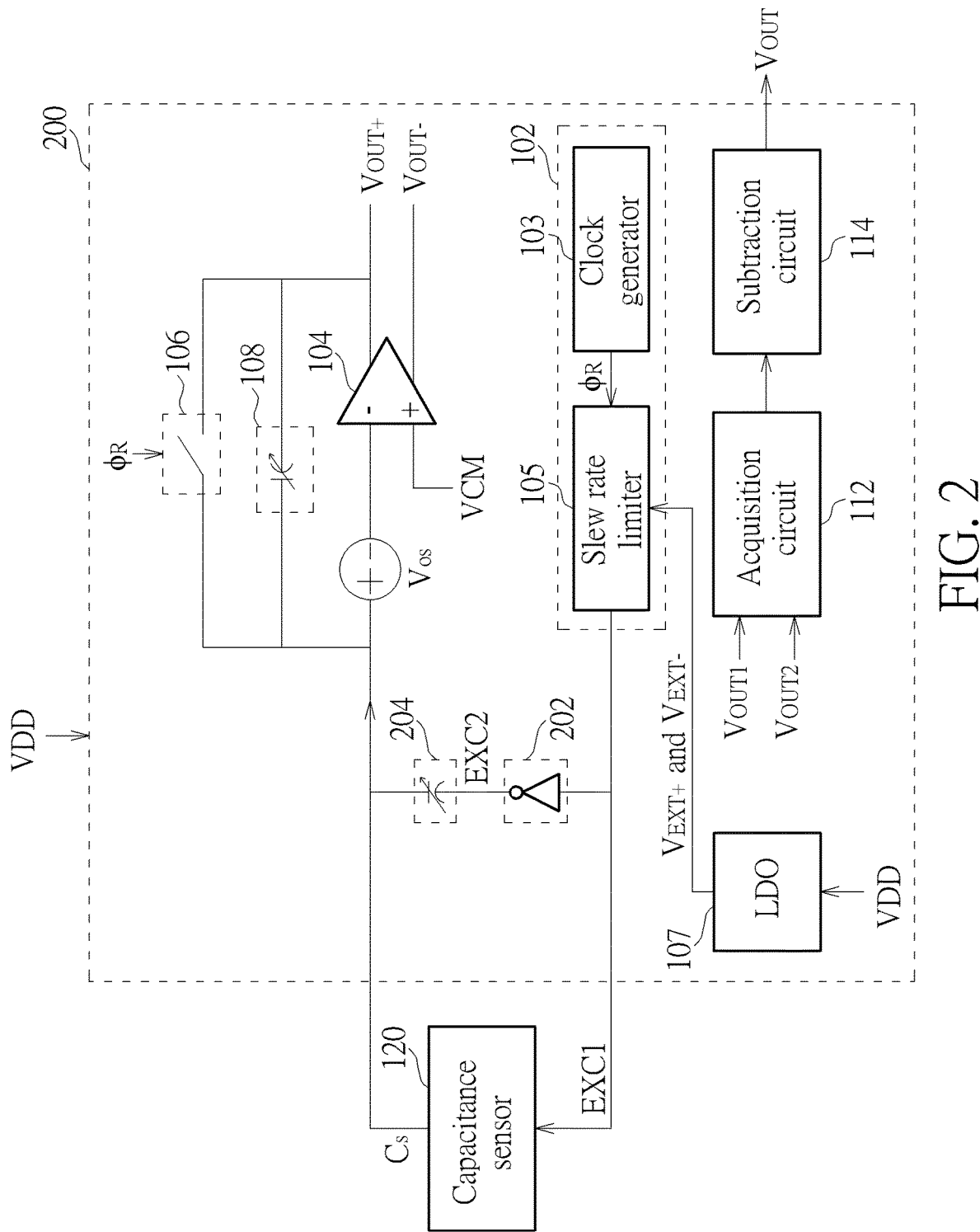
FIG. 2 is a diagram illustrating a charge to voltage converter according to a second embodiment of the present invention.
Figure 3:
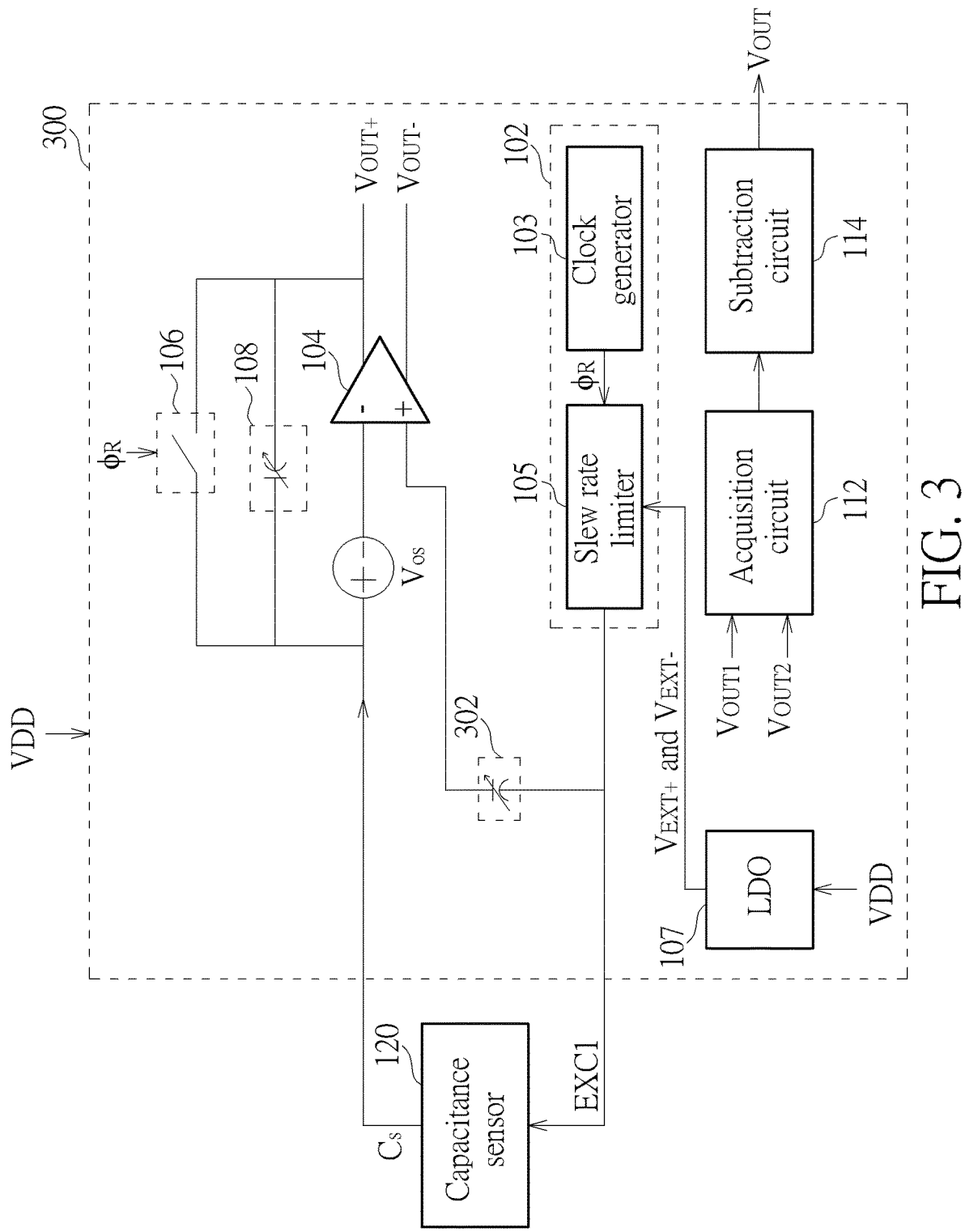
FIG. 3 is a diagram illustrating a charge to voltage converter according to a third embodiment of the present invention.
Figure 4:
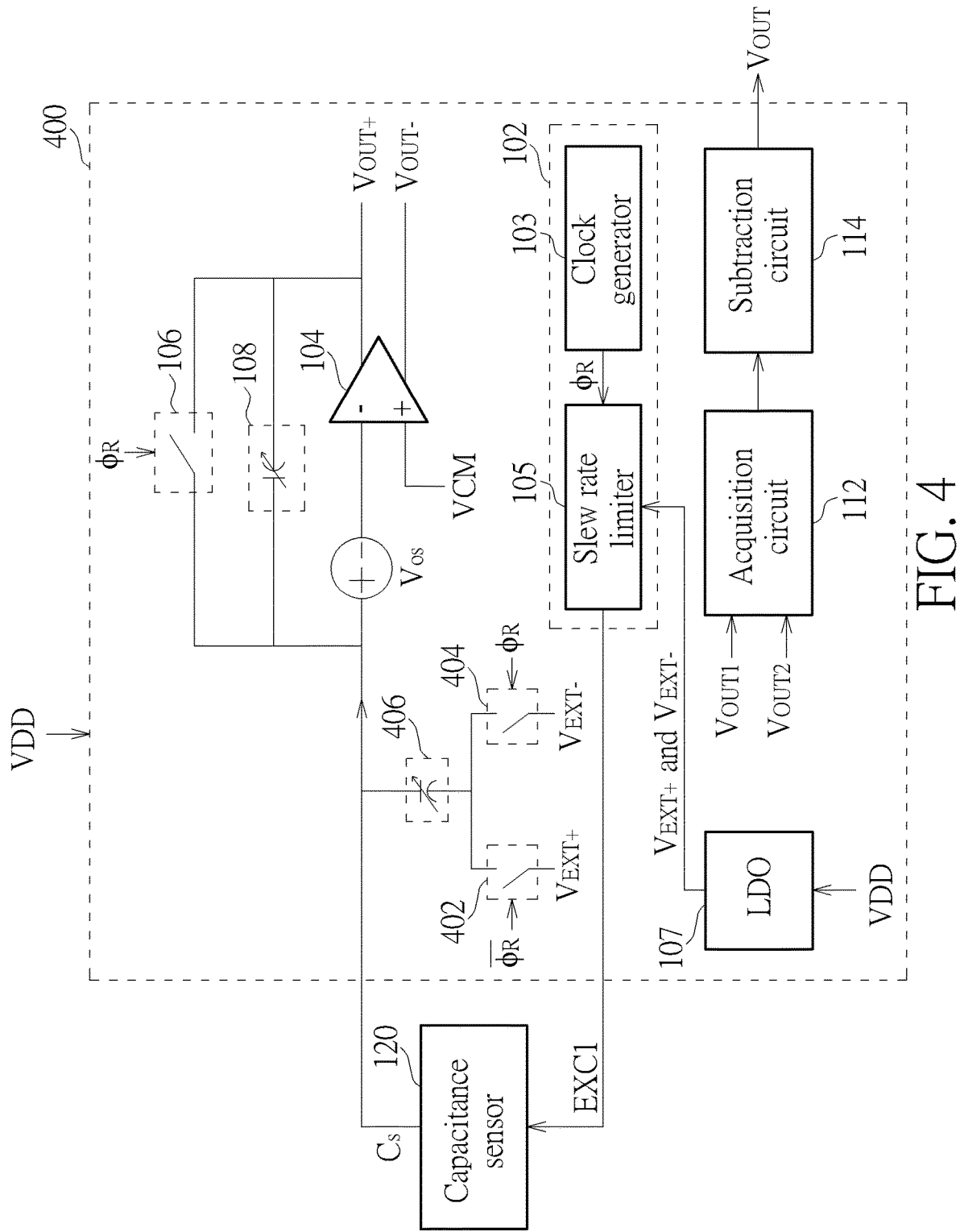
FIG. 4 is a diagram illustrating a charge to voltage converter according to a fourth embodiment of the present invention.

The implementation of the parasitic capacitance cancellation circuit 110 may be illustrated in FIG. 2, FIG. 3, and FIG. 4. FIG. 2 is a diagram illustrating a CVC 200 according to a second embodiment of the present invention. The difference between the CVC 100 shown in FIG. 1 and the CVC 200 shown in FIG. 2 is that the parasitic capacitance cancellation circuit 110 of the CVC 100 may be implemented by an inverter 202 and at least one variable capacitor 204 of the CVC 200. As shown in FIG. 2, the inverter 202 may be coupled to the slew rate limiter 105, and may be arranged to invert the excitation signal EXC1 to generate an inverted excitation signal EXC2. The at least one variable capacitor 204 may be coupled to the inverter 202 and the inverting input terminal of the differential amplifier 104, and may have multiple capacitance values to be selected. For example, the at least one variable capacitor 204 can be configured as a certain value (e.g. a capacitance value selected from the multiple capacitance values) that is equal to the parasitic capacitance value $C_P$, to perform parasitic capacitance reduction/cancellation according to the inverted excitation signal EXC2. The output voltage $V_{OUT}$ may be expressed by the following equation:

$$V_{OUT} = (V_{EXT+} - V_{EXT-}) * \frac{C_S - C_{DAC}}{C_i}$$

wherein $C_{DAC}$ is the capacitance value of the at least one variable capacitor 204, and the parasitic capacitance value $C_P$ from the sensing capacitance value $C_s$ can be reduced/canceled by the capacitance value $C_{DAC}$ of the at least one variable capacitor 204.

FIG. 3 is a diagram illustrating a CVC 300 according to a third embodiment of the present invention. The difference between the CVC 100 shown in FIG. 1 and the CVC 300 shown in FIG. 3 is that the parasitic capacitance cancellation circuit 110 of the CVC 100 may be implemented by at least one variable capacitor 302 of the CVC 300. As shown in FIG. 3, the at least one variable capacitor 302 may be coupled between the slew limiter 105 and the non-inverting input terminal of the differential amplifier 104 (i.e. the non-inverting input terminal of the differential amplifier 104 may be modified to be coupled to the at least one variable capacitor 302), and may have multiple capacitance values to be selected. For example, a register (not shown) may be arranged to set up the at least one variable capacitor 302 to select one of the multiple capacitance values that is equal to the parasitic capacitance value $C_P$ as a capacitance value of the at least one variable capacitor 302, to perform parasitic capacitance reduction/cancellation. For brevity, similar descriptions for this embodiment are not repeated in detail here.

FIG. 4 is a diagram illustrating a CVC 400 according to a fourth embodiment of the present invention. The difference between the CVC 100 shown in FIG. 1 and the CVC 400 shown in FIG. 4 is that the parasitic capacitance cancellation circuit 110 of the CVC 100 may be implemented by two switch circuits 402 and 404 and at least one variable capacitor 406 of the CVC 400. As shown in FIG. 4, the switch circuit 402 has a first terminal and a second terminal, wherein the first terminal of the switch circuit 402 may be arranged to receive the excitation voltage $V_{EXT+}$ (which is the high voltage level of the excitation signal EXC1) from the LDO regulator 107, the switch circuit 402 is controlled by a control signal $\overline{\Phi_R}$ for connecting the excitation voltage $V_{EXT+}$ to the second terminal of the switch circuit 402, and the control signal $\overline{\Phi_R}$ and the excitation signal EXC1 are out-of-phase. It is assumed that in response to the control signal $\overline{\Phi_R}$ being at the high voltage level (i.e. the excitation signal EXC1 is at the low voltage level), the switch circuit 402 is closed. In response to the control signal $\overline{\Phi_R}$ being at the low voltage level (i.e. the excitation signal EXC1 is at the high voltage level), the switch circuit 402 is open.

The switch circuit 404 has a first terminal and a second terminal, wherein the first terminal of the switch circuit 404 may be arranged to receive the excitation voltage $V_{EXT-}$ (which is the low voltage level of the excitation signal EXC1) from the LDO regulator 107, and the switch circuit 404 is controlled by a control signal that is in-phase with the excitation signal EXC1 (e.g. the clock signal $\Phi_R$) for connecting the excitation voltage $V_{EXT-}$ to the second terminal of the switch circuit 404. It is assumed that in response to the clock signal $\Phi_R$ being at the high voltage level (i.e. the excitation signal EXC1 is also at the high voltage level), the switch circuit 404 is closed. In response to the clock signal $\Phi_R$ being at the low voltage level (i.e. the excitation signal EXC1 is also at the low voltage level), the switch circuit 404 is open.

The at least one variable capacitor 406 may be coupled to the second terminal of the switch circuit 402, the second terminal of the switch circuit 404, and the inverting terminal of the differential amplifier 104, and may have multiple capacitance values to be selected. For example, a register (not shown) may be arranged to set up the at least one capacitor 406 to select one of the multiple capacitance capacitor values that is equal to the parasitic capacitance value $C_P$ as a capacitance value $C_{DAC}$ of the at least one capacitor 406, to perform parasitic capacitance reduction/cancellation. For brevity, similar descriptions for this embodiment are not repeated in detail here.

Figure 5:
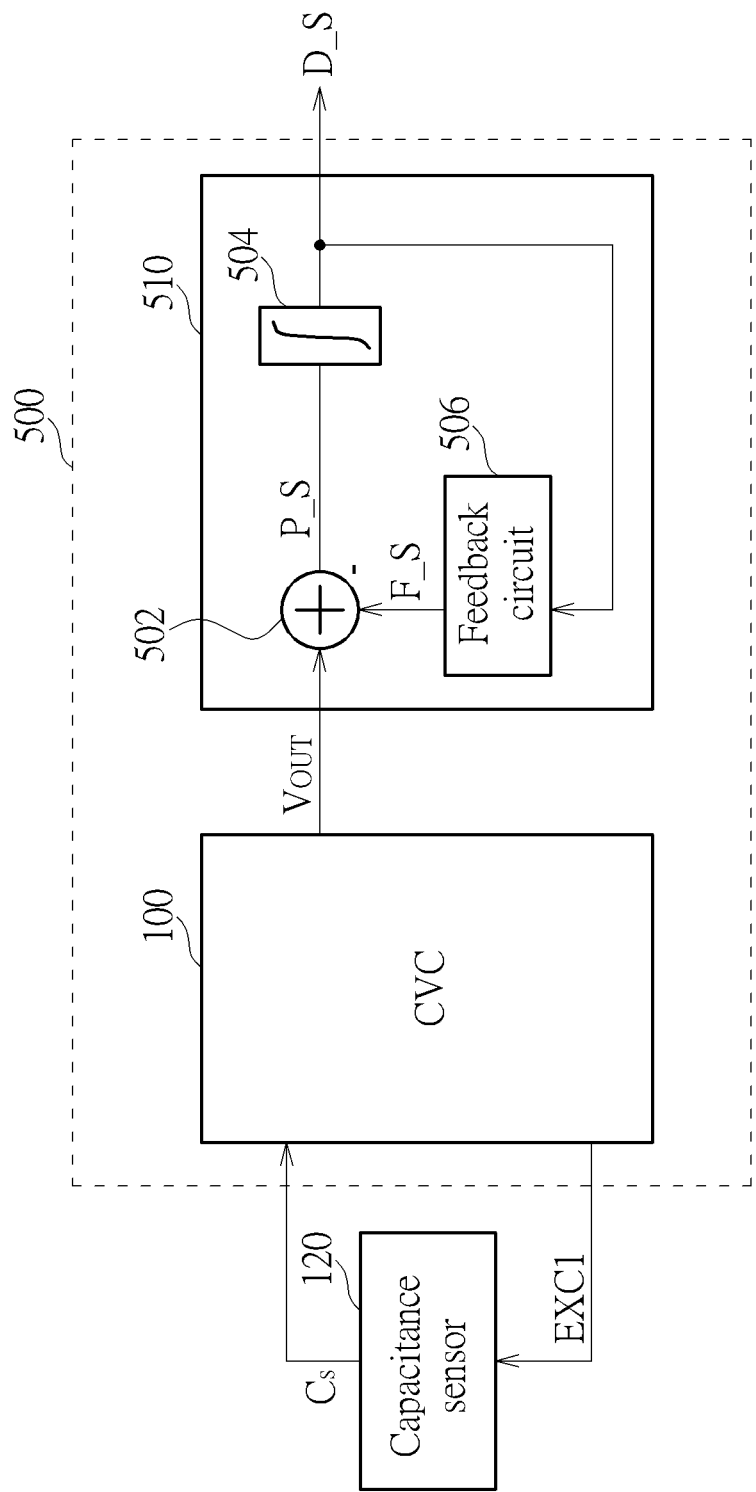
FIG. 5 is a diagram illustrating a capacitance measurement circuit according to an embodiment of the present invention.

FIG. 5 is a diagram illustrating a capacitance measurement circuit 500 according to an embodiment of the present invention, wherein the capacitance measurement circuit 500 is a capacitance to digital converter (CDC). As shown in FIG. 5, the capacitance measurement circuit 500 may include the CVC 100 shown in FIG. 1 and an analog to digital converter (ADC) 510, wherein the ADC 510 may be arranged to convert the output voltage $V_{OUT}$ into a digital pulse stream D_S. In this embodiment, the ADC 510 is a sigma-delta ADC, but the present invention is not limited thereto. In practice, any ADC architecture that is capable of converting the output voltage $V_{OUT}$ into the digital pulse stream D_S may be employed by the ADC 510. These alternative designs all fall within the scope of the present invention.

The ADC 510 may at least include a subtraction circuit 502, an integrator circuit 504, and a feedback circuit 506. The subtraction circuit 502 may be arranged to receive the output voltage $V_{OUT}$ from the CVC 100 (more particularly, the subtraction circuit 114), and subtract a feedback signal F_S from the output voltage $V_{OUT}$, to generate a processed signal P_S. The integrator circuit 504 may be coupled to the subtraction circuit 502, and may be arranged to integrate the processed signal P_S to generate the digital pulse stream D_S. The feedback circuit 506 may be coupled to the integrator circuit 504 and the subtraction circuit 502, and may be arranged to derive the feedback signal F_S from the digital pulse stream D_S, and transmit the feedback signal F_S to the subtraction circuit 502. Since the sigma-delta ADC is well known to those skilled in the art, the details of the ADC 510 will be omitted for brevity.

In summary, in the CVC 100 of the present invention, the differential amplifier 104 within the CVC 100 will not have the input offset voltage problem by the configuration between the differential amplifier 104, the switch circuit 106, and the at least one variable capacitor 108. Under a condition that the sensing capacitance value $C_s$ sensed by the capacitance sensor 120 includes a parasitic capacitance value $C_P$, the parasitic capacitance value $C_P$ can be eliminated by the parasitic capacitance cancellation circuit 110. In addition, the CVC 100 is a single-terminal input and double-terminal output configuration through the differential amplifier 104, which can increase the design flexibility, and the output voltage $V_{OUT}$ generated by the CVC 100 will not vary with the supply voltage VDD by the slew rate limiter 105.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A capacitance measurement circuit, comprising:
    a charge to voltage converter (CVC), comprising:
        an excitation signal generation circuit, arranged to generate and connect an excitation signal to a first terminal of a capacitance sensor external to the CVC, for generating a sensing capacitance value;
        a differential amplifier, having an inverting input terminal, a non-inverting input terminal, an inverting output terminal, and a non-inverting output terminal, wherein the inverting input terminal is coupled to a second terminal of the capacitance sensor, and is arranged to receive the sensing capacitance value from the second terminal of the capacitance sensor;
        a first switch circuit, coupled between the inverting input terminal and the non-inverting output terminal of the differential amplifier; and
        at least one first variable capacitor, wherein the first switch circuit and the at least one variable capacitor are connected in parallel at the inverting input terminal and the non-inverting output terminal of the differential amplifier.

2. The capacitance measurement circuit of claim 1, wherein an input offset voltage is at the inverting input terminal or the non-inverting input terminal of the differential amplifier, and the input offset voltage is reduced by the first switch circuit, the at least one first variable capacitor, and the differential amplifier.

3. The capacitance measurement circuit of claim 2, wherein the first switch circuit is controlled by a control signal, the control signal and the excitation signal are in-phase, and the CVC further comprises:
an acquisition circuit, arranged to:
in response to the first switch circuit being closed, acquire a first voltage difference between the inverting output terminal and the non-inverting output terminal of the differential amplifier; and
in response to the first switch circuit being open, acquire a second voltage difference between the inverting output terminal and the non-inverting output terminal of the differential amplifier; and
a subtraction circuit, arranged to subtract the first voltage difference from the second voltage difference, to reduce the input offset voltage and generate an output voltage of the CVC.

4. The capacitance measurement circuit of claim 3, wherein the output voltage is proportional to the sensing capacitance value.

5. The capacitance measurement circuit of claim 1, wherein the differential amplifier is a chopper amplifier.

6. The capacitance measurement circuit of claim 1, wherein a supply voltage is supplied to the CVC, and a high voltage level of the excitation signal is different from the supply voltage.

7. The capacitance measurement circuit of claim 6, wherein an output voltage of the CVC is insensitive to the supply voltage.

8. The capacitance measurement circuit of claim 1, wherein a capacitance value of one of multiple capacitors is selected as a capacitance value of the at least one first variable capacitor according to the sensing capacitance value, to make a ratio of the sensing capacitance value to said one of multiple capacitance values be a fixed value.

9. The capacitance measurement circuit of claim 1, wherein the excitation signal generation circuit comprises:
a clock generator, arranged to generate a clock signal; and
a slew rate limiter, arranged to perform a slew rate limitation operation upon the clock signal to generate the excitation signal, and connect the excitation signal to the first terminal of the capacitance sensor.

10. The capacitance measurement circuit of claim 9, wherein the CVC further comprises:
a parasitic capacitance cancellation circuit, arranged to reduce a parasitic capacitance value from the sensing capacitance value.

11. The capacitance measurement circuit of claim 10, wherein the parasitic capacitance cancellation circuit comprises:
an inverter, coupled to the slew rate limiter, and arranged to invert the excitation signal to generate an inverted excitation signal; and
at least one second variable capacitor, coupled to an output terminal of the inverter and the inverting input terminal of the differential amplifier, wherein a capacitance value of one of multiple capacitors that is equal to the parasitic capacitance value is selected as a capacitance value of the at least one second variable capacitor, to perform parasitic capacitance reduction according to the inverted excitation signal.

12. The capacitance measurement circuit of claim 10, wherein the parasitic capacitance cancellation circuit comprises:
at least one second variable capacitor, coupled between the slew rate limiter and the non-inverting input terminal of the differential amplifier, and arranged to perform parasitic capacitance reduction.

13. The capacitance measurement circuit of claim 1, wherein the CVC further comprises:
a parasitic capacitance cancellation circuit, arranged to reduce a parasitic capacitance value from the sensing capacitance value.

14. The capacitance measurement circuit of claim 13, wherein the parasitic capacitance cancellation circuit comprises:
a second switch circuit, having a first terminal and a second terminal, wherein the first terminal of the second switch circuit is arranged to receive a high voltage level of the excitation signal, the second switch circuit is controlled by a first control signal for connecting the high voltage level of the excitation signal to the second terminal of the second switch circuit, and the first control signal and the excitation signal are out-of-phase;
a third switch circuit, having a first terminal and a second terminal, wherein the first terminal of the third switch circuit is arranged to receive a low voltage level of the excitation signal, the second switch circuit is controlled by a second control signal for connecting the low voltage level of the excitation signal to the second terminal of the third switch circuit, and the second control signal and the excitation signal are in-phase; and
at least one second variable capacitor, coupled to the second terminal of the second switch circuit, the second terminal of the third switch circuit, and the inverting input terminal of the differential amplifier, wherein a capacitance value of one of multiple capacitors that is equal to the parasitic capacitance value is selected as a capacitance value of the at least one second variable capacitor, to perform parasitic capacitance reduction.

15. The capacitance measurement circuit of claim 1, wherein the CVC is arranged to generate an output voltage according to the sensing capacitance value; and the capacitance measurement circuit is a capacitance to digital converter (CDC), and further comprises:
an analog to digital converter (ADC), arranged to convert the output voltage into a digital pulse stream.

16. The capacitance measurement circuit of claim 15, wherein the ADC is a sigma-delta ADC, and the sigma-delta ADC at least comprises:
a subtraction circuit, arranged to receive the output voltage from the CVC, and subtract a feedback signal from the output voltage, to generate a processed signal;
an integrator circuit, coupled to the subtraction circuit, and arranged to integrate the processed signal to generate the digital pulse stream; and
a feedback circuit, coupled to the integrator circuit and the subtraction circuit, and arranged to derive the feedback signal from the digital pulse stream, and transmit the feedback signal to the subtraction circuit.

* * * * *